US012666582B2

(12) United States Patent
Bourniche et al.

(10) Patent No.: US 12,666,582 B2
(45) Date of Patent: Jun. 23, 2026

(54) SYSTEMS AND METHODS FOR A DIRECT PRINTED HEAT SINK

(71) Applicant: BorgWarner US Technologies LLC, Wilmington, DE (US)

(72) Inventors: Eric Bourniche, Preutin-Higny (FR); Pascal David, Luxembourg (LU); Arnaud Leblay, Beuveille (FR)

(73) Assignee: BorgWarner US Technologies LLC, Wilmington, DE (US)

( * ) Notice: Subject to any disclaimer, the term of this patent is extended or adjusted under 35 U.S.C. 154(b) by 38 days.

(21) Appl. No.: 18/473,959

(22) Filed: Sep. 25, 2023

(65) Prior Publication Data

US 2025/0107050 A1     Mar. 27, 2025

(51) Int. Cl.
| | |
|---|---|
| *H05K 7/20* | (2006.01) |
| *H02M 7/00* | (2006.01) |
| *B33Y 80/00* | (2015.01) |

(52) U.S. Cl.
CPC ........ H05K 7/20927 (2013.01); H02M 7/003 (2013.01); H05K 7/20263 (2013.01); H05K 7/20418 (2013.01); B33Y 80/00 (2014.12)

(58) Field of Classification Search
None
See application file for complete search history.

(56) References Cited

U.S. PATENT DOCUMENTS

| | | | |
|---|---|---|---|
| 6,812,553 B2 | 11/2004 | Gerbsch et al. | |
| 6,943,293 B1 | 9/2005 | Jeter et al. | |
| 7,095,098 B2 | 8/2006 | Gerbsch et al. | |
| 7,229,855 B2 | 6/2007 | Murphy | |
| 7,295,433 B2 | 11/2007 | Taylor et al. | |
| 7,538,425 B2 | 5/2009 | Myers et al. | |
| 7,551,439 B2 | 6/2009 | Peugh et al. | |
| 9,888,568 B2 * | 2/2018 | Parker | H05K 1/0298 |
| 2008/0079021 A1 | 4/2008 | Bayerer et al. | |
| 2011/0281070 A1 * | 11/2011 | Mittal | B05D 3/007 |
| | | | 428/221 |
| 2015/0197063 A1 * | 7/2015 | Shinar | G06F 30/39 |
| | | | 700/98 |
| 2018/0208762 A1 * | 7/2018 | Pomestchenko | B29C 71/02 |
| 2021/0367526 A1 * | 11/2021 | Harel | H02M 7/003 |

FOREIGN PATENT DOCUMENTS

| | | |
|---|---|---|
| CN | 110797318 A | 2/2020 |
| DE | 102019105483 A1 | 9/2020 |
| EP | 3261119 A1 | 12/2017 |

OTHER PUBLICATIONS

Sewergin Alexander et al: "Comparison of High Performance Cooling Concepts for SiC Power Modules", 2019 IEEE Applied Power Electronics Conference and Exposition (APEC), IEEE, Mar. 17, 2019 (Mar. 17, 2019), pp. 2822-2825, XP033555180.

* cited by examiner

*Primary Examiner* — Courtney L Smith
(74) *Attorney, Agent, or Firm* — Joshua M. Haines; Bookoff McAndrews, PLLC

(57) ABSTRACT

A system for an electric vehicle includes a power switch configured to convert DC power from a battery to AC power to drive a motor, and a three-dimensionally printed heat sink (3D heat sink) coupled to the power switch.

14 Claims, 6 Drawing Sheets

SYSTEMS AND METHODS FOR A DIRECT PRINTED HEAT SINK

TECHNICAL FIELD

Various embodiments of the present disclosure relate generally to a power module cooling system, and, more particularly, to systems and methods for a printed heat sink on a direct bonding layer of a power module.

INTRODUCTION

Thermal management is considered a key technical aspect in an electric vehicle system. A cooling module of an inverter system controls the performance and efficiency of an overall driving system of an electric vehicle. However, some cooling modules may have limited capability for thermal performance optimization.

The present disclosure is directed to overcoming one or more of these above-referenced challenges.

SUMMARY OF THE DISCLOSURE

In some aspects, the techniques described herein relate to a system for an electric vehicle, the system including: a power switch configured to convert DC power from a battery to AC power to drive a motor; and a three-dimensionally printed heat sink (3D heat sink) coupled to the power switch.

In some aspects, the techniques described herein relate to a system, wherein the power switch includes silicon carbide.

In some aspects, the techniques described herein relate to a system, the power switch further including a direct bonding material layer, the 3D heat sink being three-dimensionally printed onto the direct bonding material layer, the direct bonding material layer being a material configured to allow for the 3D heat sink to be three-dimensionally printed onto the direct bonding material layer.

In some aspects, the techniques described herein relate to a system, further including: a direct bonding material layer coupled to the power switch by a solder material, wherein the 3D heat sink is three-dimensionally printed onto the direct bonding material layer, the direct bonding material layer being a material configured to allow for the 3D heat sink to be three-dimensionally printed onto the direct bonding material layer.

In some aspects, the techniques described herein relate to a system, wherein the direct bonding material layer includes: a first copper layer; an aluminum nitride layer; and a second copper layer, wherein the aluminum nitride layer is located between the first copper layer and the second copper layer.

In some aspects, the techniques described herein relate to a system, further including: a second solder material coupled to the power switch; a second direct bonding material layer coupled to the second solder material; and a second heat sink three-dimensionally printed to the second direct bonding material layer, the second direct bonding material layer being of a material configured to allow for the 3D heat sink to be three-dimensionally printed onto the direct bonding material layer.

In some aspects, the techniques described herein relate to a system, wherein the second direct bonding material layer includes: a first copper layer; an aluminum nitride layer; and a second copper layer.

In some aspects, the techniques described herein relate to a system, further including: a second solder material coupled to the power switch; a second direct bonding material layer coupled to the second solder material; a thermal interface material coupled to the second direct bonding material layer; and a second heat sink coupled to the thermal interface material.

In some aspects, the techniques described herein relate to a system, wherein the direct bonding material layer and the 3D heat sink are a same material.

In some aspects, the techniques described herein relate to an inverter including the system.

In some aspects, the techniques described herein relate to an inverter including: a power module including: a first power switch; a three-dimensionally printed first heat sink (first 3D heat sink) coupled to the first power switch, the first 3D heat sink including a first inlet and a first outlet; a second power switch; and a three-dimensionally printed second heat sink (second 3D heat sink) coupled to the second power switch, the second 3D heat sink including a second inlet and a second outlet; wherein the first outlet of the first 3D heat sink is fluidly coupled to the second inlet of the second 3D heat sink.

In some aspects, the techniques described herein relate to an inverter, the first power switch including a first direct bonding material layer, the first 3D heat sink being three-dimensionally printed onto the first direct bonding material layer, and the second power switch including a second direct bonding material layer, the second 3D heat sink being three-dimensionally printed onto the second direct bonding material layer.

In some aspects, the techniques described herein relate to an inverter, the first power switch further including a first direct bonding material layer coupled to the first power switch by a first solder material, wherein the first 3D heat sink is three-dimensionally printed onto the first direct bonding material layer, the first direct bonding material layer being a material configured to allow for the first 3D heat sink to be three-dimensionally printed onto the first direct bonding material layer; the second power switch further including a second direct bonding material layer coupled to the second power switch by a second solder material, wherein the second 3D heat sink is three-dimensionally printed onto the second direct bonding material layer, the second direct bonding material layer being a material configured to allow for the second 3D heat sink to be three-dimensionally printed onto the second direct bonding material layer.

In some aspects, the techniques described herein relate to an inverter, wherein the first direct bonding material layer includes: a first copper layer; an aluminum nitride layer; and a second copper layer, wherein the aluminum nitride layer is located between the first copper layer and the second copper layer.

In some aspects, the techniques described herein relate to an inverter, wherein the second direct bonding material layer includes: a third copper layer; a second aluminum nitride layer; and a fourth copper layer, wherein the second aluminum nitride layer is located between the third copper layer and the fourth copper layer.

In some aspects, the techniques described herein relate to an inverter, the first 3D heat sink further including: a third direct bonding material layer coupled to the first power switch by a third solder layer; and a three-dimensionally printed third heat sink (third 3D heat sink) three-dimensionally printed to the third direct bonding material layer, the third 3D heat sink including a third inlet and a third outlet; and the second 3D heat sink further including: a fourth direct bonding material layer coupled to the second power switch by a fourth solder layer; and a three-dimensionally printed fourth heat sink (fourth 3D heat sink) three-dimensionally printed to the fourth direct bonding material layer, the fourth 3D heat sink including a fourth inlet and a fourth outlet; wherein the third outlet of the third 3D heat sink is fluidly coupled to the fourth inlet of the fourth 3D heat sink.

In some aspects, the techniques described herein relate to an inverter, wherein the first 3D heat sink is a same material as a layer of the first direct bonding material layer.

In some aspects, the techniques described herein relate to an inverter, wherein the second 3D heat sink is a same material as a layer of the second direct bonding material layer.

In some aspects, the techniques described herein relate to a vehicle including the inverter.

In some aspects, the techniques described herein relate to a method of forming a cooling module assembly, the method including: three-dimensionally printing a heat sink onto a power switch configured to convert DC power from a battery to AC power to drive a motor.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
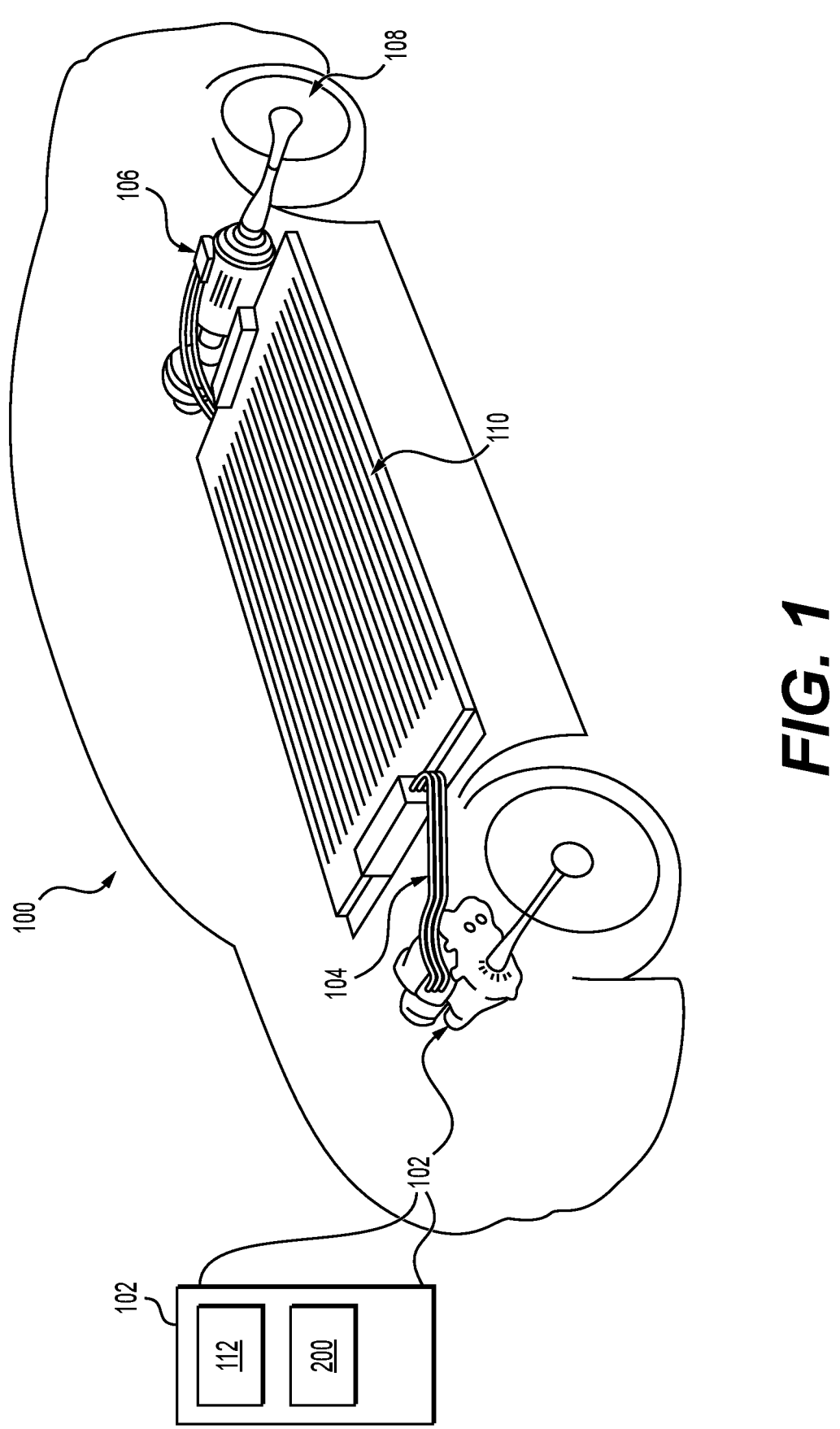
FIG. 1 depicts an exemplary system infrastructure for a vehicle including an inverter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to a power module cooling system, and, more particularly, to systems and methods for a direct printed heat sink.

Inverters, such as those used to drive a motor in an electric vehicle, for example, are responsible for converting High Voltage Direct Current ("HVDC") into Alternating Current ("AC") to drive a motor. Inverters may include a power module and corresponding cooling modules assemblies configured to cool the power modules. Power module may include one or more silicon carbide ("SiC")-based power switches that deliver relatively high power densities and efficiencies needed to extent battery range and performance. The power module may contain circuitry and components that are configured to convert DC current from the electric vehicle battery to AC current, which can be utilized within the electric motor that drives the propulsion system. The cooling assemblies of the inverter may transfer waste heat (e.g., heat generated while in operation) from the system to a coolant associated with the fluid circuits and transfer the fluid to a radiator, heat exchanger, or other engine components, as described herein.

Inverter systems may have high ambient temperature during operation. The performance, assembly process and time, and reliability of the power modules of an inverter system may all be dependent on a built-in coolant structure. Cooling structures of inverter systems may improve performance and reliability. Some inverter systems utilize thermal management methods to cool the active components of the power module.

For example, some thermal management methods may include a direct bonding material (DBM) being attached to a heatsink via a welded baseplate that is attached to the heat sink using a thermal interface material (TIM). As a result of this configuration, the junction to coolant thermal resistance may be relatively high, resulting in a lower current density capability.

For example, some thermal management methods have double side cooling, where a DBM is applied to both a first surface and a second surface of a power silicon die, the first and second surface being opposite of one another. Both DBMs may be attached to respective heat sinks using TIM. In this thermal management system, TIM may be necessary to ensure that all the DBM area is in contact with the respective heat sink in each stack-up and/or thermomechanical stress condition. The junction to coolant thermal resistance of the assembly for this thermal management method may be highly degraded by the TIM layer that has poor thermal conductivity. The TIM may act as a bottleneck in the thermal exchange from the power silicon die to the respective heat sinks. This may limit the current density achievable in the respective power modules. This may limit the current density achievable in a silicon die and lead to as much as double current density capability. To compensate for this limitation, power modules may require more silicon. This may lead to a higher amount of material required for an inverter.

One or more embodiments may include a cooling module assembly for a power module that includes a heat sink (e.g., two heat sinks) directly printed to the power module. The heat sink may be directly printed to the DBM of the power module. One or more embodiments may be achieved by a laser metal fusion process (e.g., metal additive manufacturing). For example, metal powder layers may be melted by a laser. One or more embodiments may include no interfacial thermal resistance between a heat sink and a power module. The power modules may not include a stack-up issue within the power module. In particular, TIM layers may have a relatively large tolerance of thickness, creating large stack-up values.

One or more embodiments may allow for an aluminum heat sink printed on a direct bond aluminum (DBA) layer and a copper heat sink printed on a direct bond copper (DBC) layer of components (e.g., of power modules). Various other heat sinks of different metals may be printed on corresponding types of metals utilizing the systems and methods described herein.

One or more embodiments may exclude TIM layers from a power module and the thermal resistance associated with the TIM layer may be removed. The power module without a TIM layer may have an improved thermal performance compared to power module systems that include a TIM layer. As a result of the lower thermal resistance and improved thermal performance, a higher current density may be achieved for a given power silicon content of a power module. Alternatively, as a result, a reduced price of materials may be achieved at a set current density for a power module.

One or more embodiments may include a heat sink that is printed with the same material as the DBM layer. This may allow for the same conductivity to apply from the DBM to the heat sink, allowing for low thermal resistance from junction to coolant.

One or more embodiments may include a heat sink that includes pin fins or other features to optimize the thermal performance of the heat sink. The pin fins may for example be used to disperse heat into a coolant that flows through the heat sink.

FIG. 1 depicts an exemplary system infrastructure for a vehicle including an inverter, according to one or more embodiments. Electric vehicle 100 may include inverter 102, connectors 104, drive motor 106, wheels 108, and battery 110. The inverter 102 may include power module 112 and a cooling module assembly 200. Cooling module assembly 200 may be used to cool power module 112. Connectors 104 may connect the inverter 102 and battery 110. Inverter 102 may include components to receive electrical power from an external source and output electrical power to charge battery 110 of electric vehicle 100. Inverter 102, through the use of a power module 112, may convert DC power from battery 110 in electric vehicle 100 to AC power, to power the drive motor 106 and wheels 108 of electric vehicle 100, for example, but the embodiments are not limited thereto. The inverter 102 may be bidirectional, and may convert DC power to AC power, or convert AC power to DC power, such as during regenerative braking, for example. Inverter 102 may be a single-phase inverter, or a multi-phase inverter, such as a three-phase inverter, for example.

Figures 2A, 2B:
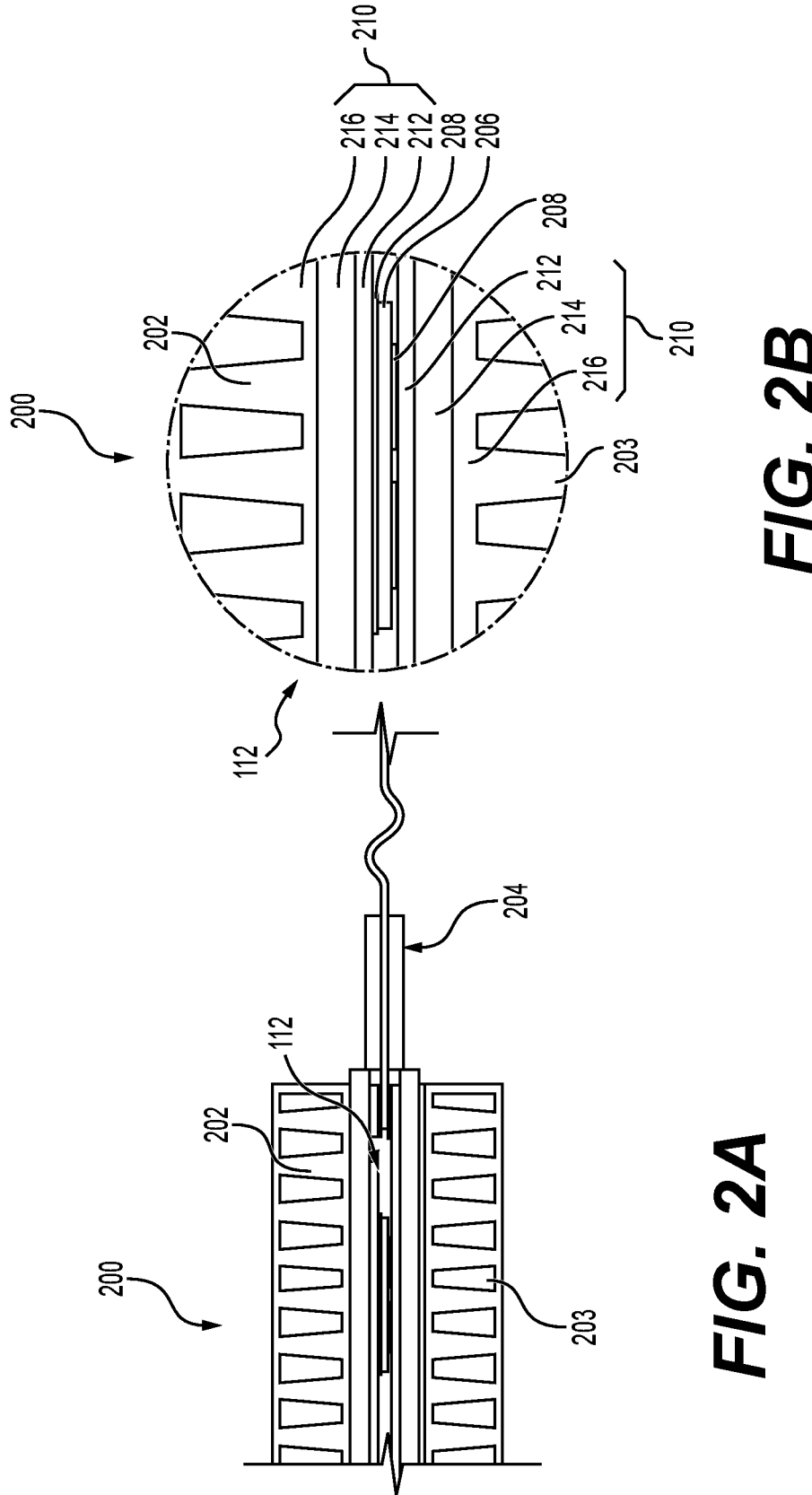
FIG. 2A depicts a cooling module assembly for dual side direct printed heat sink on a power module, according to one or more embodiments.
FIG. 2B depicts a cooling module assembly for a dual side direct printed heat sink on a direct bonding material of a power module, according to one or more embodiments.
Figures 4, 5:
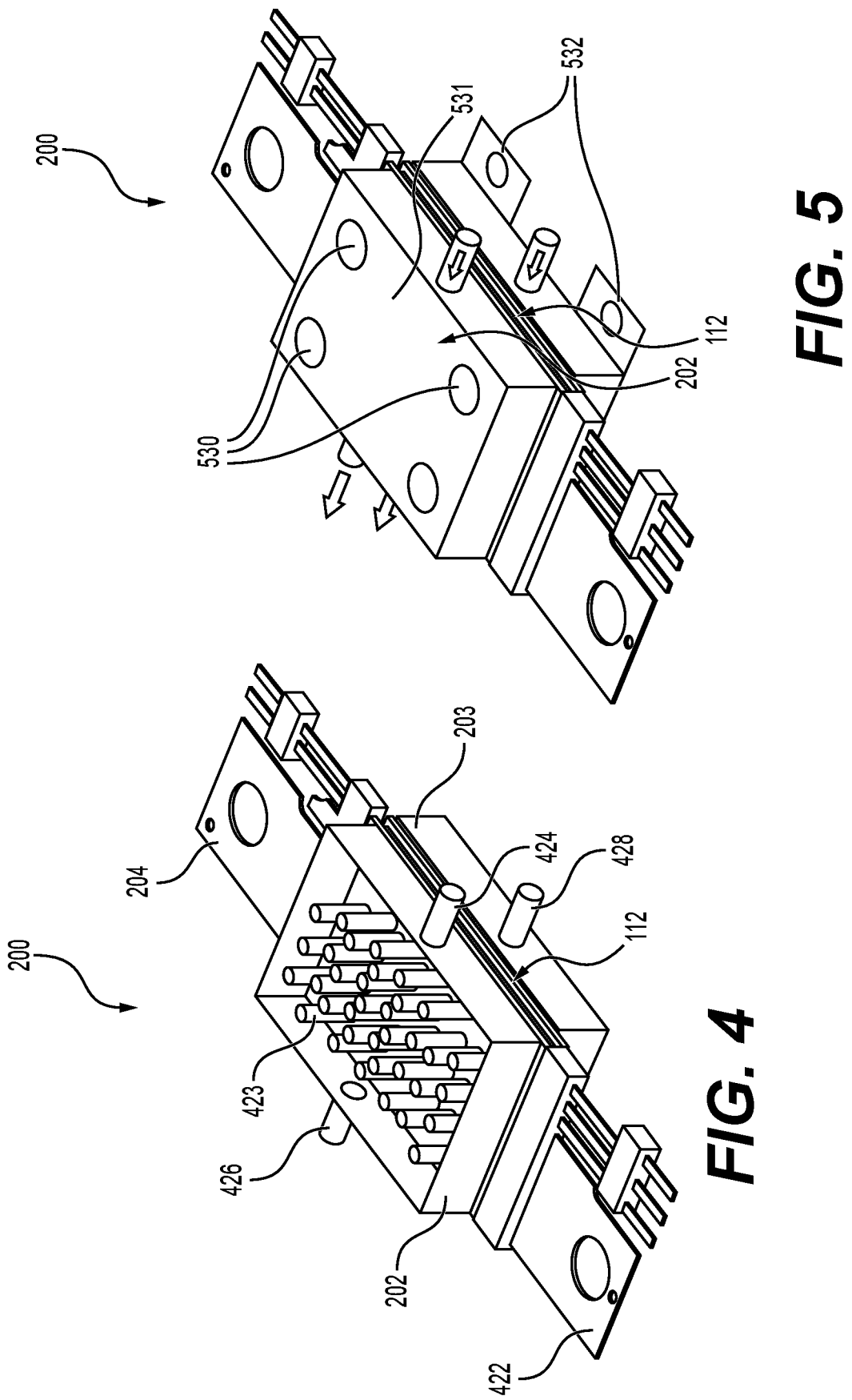
FIG. 4 depicts a perspective view of a top layer cross section of the heat sink of a cooling module assembly, according to one or more embodiments.
FIG. 5 depicts a perspective view of structural features of a cooling module assembly, according to one or more embodiments.

FIG. 2A depicts a cooling module assembly 200 for a dual side direct printed heat sink on a power module 112, according to one or more embodiments. The cooling module assembly 200 may include a power module 112 (e.g., one of more power modules), a first heat sink 202, and a second heat sink 203. The power module 112 may include a power connection tab (e.g., first tab 204 and second tab 422 as depicted in FIG. 4) configured to receive or send electrical signals from the power module 112. The first tab 204 may for example be a source or drain tab, a motor tab, or a battery tab.

The power module 112 may be located between and be in contact with a first heat sink 202 and/or a second heat sink 203. The power module 112 may include one or more silicon carbide (SiC)-based power devices (e.g., power switch 206 shown in FIG. 2B) that deliver relatively high power densities and efficiencies needed to extend battery range and performance. Power module 112 may include circuitry and components configured to convert direct current (DC) from the battery 110 to alternating current (AC) current, which may be utilized within drive motor 106 that may drive wheels 108. Power module 112 may be installed on one or more power board assemblies. Power module 112 may include a combination of transistors, diodes, metal oxide semiconductor field effect transistors (MOSFETs), insulated-gate bipolar transistors (IGBTs), and silicon-controlled rectifiers (SCRs). Power module 112 may include a combination of transistors, which may allow for the switch-ability of the direction of the current through drive motor 106 from battery 110. Additionally, power module 112 may include devices for inverting applications such as switching direct current into alternating current.

The power module 112 may be in contact with a heat sink (e.g., first heat sink 202 and/or the second heat sink 203) directly printed onto a surface of the power module 112. For example, the heat sink and an outer layer of the power module 112 (e.g., second copper layer 216 shown in FIG. 2B) may be the same material and may be in direct contact or otherwise integral with one another. This may allow for the same thermal conductivity to apply from the DBM layer 210 (depicted in FIG. 2B) of the power module 112 to the heat sink (e.g., first heat sink 202 and/or second heat sink 203). The material of first heat sink 202 and second heat sink 203 may be selected based on the thermal performance required to draw heat away from power module 112. For example, first heat sink 202 and second heat sink 203 may include copper. For example, the first heat sink 202 and second heat sink 203 may include an aluminum alloy or another suitable material.

The heat sink (e.g., the first heat sink 202 and/or the second heat sink 203) may be in the shape of a rectangle that extends perpendicular from the face of the power module 112. The heat sink may for example be the same shape as an exterior layer of the power module.

FIG. 2B depicts a cooling module assembly 200 for a dual side direct printed heat sink on a direct bonding material of a power module 112, according to one or more embodiments. FIG. 2B may depict an enlarged view of the cooling module assembly 200 from FIG. 2A.

The power module 112 may include a power switch 206 (e.g., one or more power switches, four power switches, six power switches, eight power switches), a solder layer 208 (e.g., two solder layers per power switch), and a DBM layer 210 (e.g., two layers of DBM layer 210). For example, the DBM layer 210 be considered a part of the power switch 206 or as a separate component coupled to the power switch 206. The power switch 206 may for example be made of silicon carbide ("SiC"). The power switch 206 may have a solder layer 208 applied to a face of the power switch (e.g., a first face and a second face, the second face being opposite of the first face) to couple the power switch 206 to the DBM layer 210. As a non-limiting example, the solder layer 208 may for example be 0.110 mm thick.

The solder layer 208 may be configured to connect the power switch 206 to a DBM layer 210 (e.g., two layers of DBM layer 210). The DBM layer 210 may include a first copper layer 212, an aluminum nitride layer 214, and a second copper layer 216. The first copper layer 212 may be soldered to a face of the power switch 206 (e.g., by solder layer 208). The layers may be arranged so that the first copper layer 212 is closest to the power switch 206, followed by the aluminum nitride layer 214, followed by the second copper layer 216 which may be located furthest from the power switch 206. As a non-limiting example, the first copper layer 212 and second copper layer 216 may each be for example 0.3 mm in height (height being the distance from a first surface of the copper layer closest to the power switch 206 to a second surface of the copper layer farthest from the power switch 206). As a non-limiting example, the aluminum nitride layer 214 may for be for example between 0.25 to 1 mm in height. For example, the aluminum nitride layer 214 may be 0.63 mm in height. In one example, the DBM layer 210 may alternatively include a first aluminum layer in place of the first copper layer 212, an aluminum nitride layer 214, and a second aluminum layer in place of the second copper layer 216. In this example, the heat sinks (e.g., the first heat sink 202) may be made of aluminum material.

The DBM layer 210 may stay firmly bonded when exposed to temperatures at or greater than a thousand degrees Celsius. The DBM layer 210 may have a thermal expansion matched to silicon. The DBM layer 210 may have high power and thermal cycling capability. The DBM layer 210 may further have high thermal conductivity, high current density, and low capacity.

The second copper layer 216 of the DBM layer 210 may be configured to be coupled to a heat sink (e.g., first heat sink 202). The outer layer of the DBM layer 210 (e.g., the second copper layer 216) may be a material configured to have a metal three-dimensionally printed on its surface. For example, this outer layer may be the same material as the three-dimensionally printed heat sink. For example, the heat sink may be welded to the second copper layer 216 of the DBM layer 210 by applying a laser metal fusion process. For example, metal three-dimensional printing processes may be applied such as a metal powder bed fusion. It is further contemplated that the material of the DBM layer 210 may aluminum, or another suitable metal or combination of metals. Furthermore, first copper layer 212 and second copper layer 216 may be similarly replaced with another suitable metal layer, such as, e.g., aluminum. Still further, it is contemplated that the material of the DBM layer 210 may be different than the material of first copper layer 212 and/or second copper layer 216.

For example, the power module 112 may have a power switch 206 with two faces, the first face being opposite of the second face. Each face of the power switch 206 may be soldered (e.g., by a solder layer 208) to a respective layer of DBM layer 210. Each DBM layer 210 may include an exterior layer (e.g., second copper layer 216) that is welded to a respective heat sink (e.g., the first heat sink 202 and second heat sink 203).

Figures 3A, 3B:
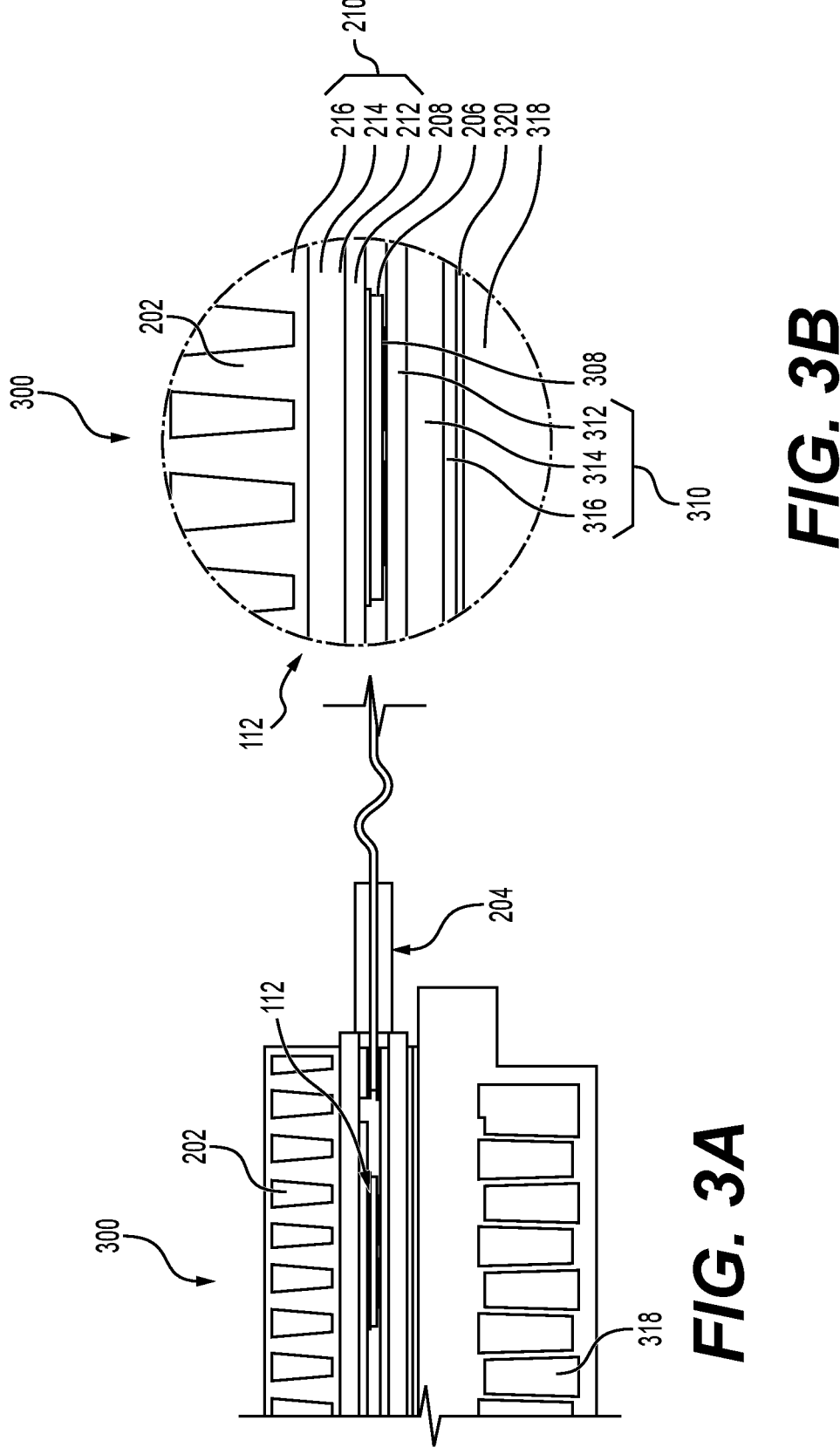
FIG. 3A depicts a cooling module assembly having a first side with a direct printed heat sink on a power module and a second opposing side having a soldered heat sink, according to one or more embodiments.
FIG. 3B depicts a cooling module assembly for a first side direct printed heat sink on a direct bonding material of a power module and a second opposing side having a soldered heat sink, according to one or more embodiments.

FIG. 3A depicts a cooling module assembly 300 having a first side with a first heat sink 202 on a power module 112 and a second opposing side having a soldered heat sink 318, according to one or more embodiments. First heat sink 202 may be direct printed.

Similar to the cooling module assembly 200, the cooling module assembly 300 may include a power module 112 (e.g., one of more power modules), a first heat sink 202. The power module 112 may include a first tab 204 configured to receive or send electrical signals from the power module 112. The cooling module assembly 300 may further include soldered heat sink 318. Unlike first heat sink 202, soldered heat sink 318 may be coupled to the power module 112 by a TIM layer (e.g., TIM layer 320) as will be described in FIG. 3B below.

FIG. 3B depicts a cooling module assembly 300 for a first side direct printed heat sink on a direct bonding material of a power module 112 and a second opposing side having a soldered heat sink 318, according to one or more embodiments. FIG. 3B may depict an enlarged view of the cooling module assembly 300 from FIG. 3A.

The power module 112 may include a power switch 206 (e.g., one or more power switches), a solder layer 208, a second solder layer 308, DBM layer 210, and a second DBM layer 310. The 3D printed side of the power module 112 of the cooling module assembly 300 may have the same components as either side of the cooling module assembly 200 from FIG. 2A (e.g., components including power switch 206, solder layer 208, DBM layer 210, first copper layer 212, aluminum nitride layer 214, and/or second copper layer 216).

The second copper layer 216 of the DBM layer 210 may be configured to be coupled to a heat sink (e.g., first heat sink 202). For example, the heat sink may be welded to the second copper layer 216 of the DBM layer 210 by applying a laser metal fusion process. For example, metal three-dimensional printing processes may be applied such as a metal power bed fusion.

The second DBM layer 310 may include a third copper layer 312, a second aluminum nitride layer 314, and a fourth copper layer 316. The third copper layer 312 may be soldered to a face of the power switch 206 (e.g., by second solder layer 308). The layers may be arranged so that the third copper layer 312 is closest to the power switch 206, followed by the second aluminum nitride layer 314, followed by the fourth copper layer 316 which may be located furthest from the power switch 206.

The fourth copper layer 316 of the second DBM layer 310 may be configured to be coupled to soldered heat sink 318. For example, the soldered heat sink 318 may be coupled via TIM layer 320 to the fourth copper layer 316 of the second DBM layer 310. The TIM layer 320 may include epoxy, silicon, or other elastomer products, for example. The TIM layer 320 may be provided as a dielectric pad, heat spreader, thermal compound, thermal gel (e.g., dispensable gel) thermal tape, phase change material, gap pad, thermal grease, or alternative thermal material, for example.

FIG. 4 depicts a top layer cross section of the first heat sink 202 of a cooling module assembly 200, according to one or more embodiments. The perspective view of FIG. 4 depicts the outer part of the first heat sink 202 removed from view to enable internal components to be viewed. The power module 112 may include a first tab 204 and a second tab 422. The first tab 204 and second tab 422 may be configured to receive and/or send electrical signals from the power module 112.

The first heat sink 202 may include an inlet 424 and an outlet 426. Both the inlet 424 and the outlet 426 may be an effective conduit, where, based on the direction of the flow of coolant, the inlet 424 may be configured as an outlet and the outlet 426 may be configured as an inlet. The second heat sink 203 may include an inlet 428 and an outlet (not shown). The inlet 424 and outlet 426 may for example be tubular in shape and include an opening through which coolant may flow. The opening may be circular or any polygon shape. The inlet (e.g., inlet 424 and inlet 428) may be configured to receive or expel coolant into the hollow interior of the heat sink (e.g., the first heat sink 202 and the second heat sink 203). The outlet (e.g., outlet 426) may be configured to expel or receive coolant from the respective heat sink (e.g., first heat sink 202 or second heat sink 203).

The first heat sink 202 may for example be hollow and configured to receive and expel coolant. The first heat sink 202 may further include fins 423 (e.g., one or more fins). The fins 423 may be the same material as the first heat sink 202. The fins 423 may be provided in an extruded, plain, wavy, pin, folded, bonded, active fan, stamping, or cross-cut configuration. The fins 423 may be located in the hollow interior of the first heat sink 202 between the inlet 424 and outlet 426. The fins 423 may have been formed directly into the second heat sink 203, as the second heat sink 203 is three-dimensionally printed onto the surface (e.g., the second copper layer 216) of the power module 112.

Figure 6:
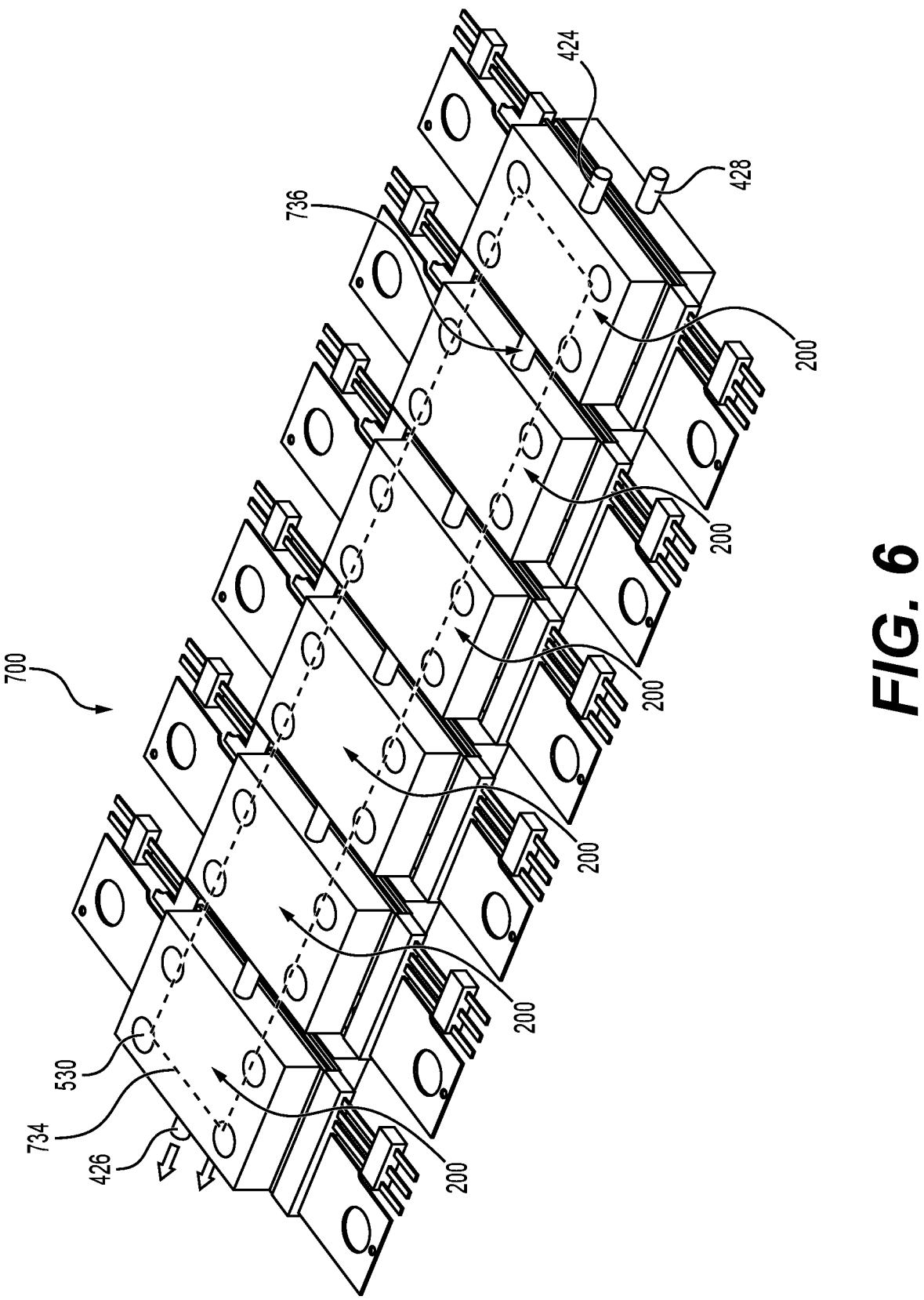
FIG. 6 depicts a perspective view of a power module with a printed heat sink, according to one or more embodiments.

The outlet 426 may for example expel coolant from the first heat sink 202. For example, the outlet 426 may expel coolant to an inlet of a separate heat sink (as shown in FIG. 6). For example, the outlet 426 may expel waste heat (e.g., heat generated while in operation of the power module) through the coolant. The coolant may be transferred to a radiator, heat exchange, or other engine component.

FIG. 5 depicts structural features of a cooling module assembly 200, according to one or more embodiments. The cooling module assembly 200 may for example include a fastening threaded hole 530 (e.g., four fastening threaded holes). The fastening threaded hole 530 may be configured to allow for a coupling component (e.g., cradle 734 as depicted in FIG. 6) to attach multiple cooling module assemblies (i.e. more than one of cooling module assembly 200). The fastening threaded hole may have been formed as the first heat sink 202 was 3D printed onto the power module 112. For example, the first heat sink 202 may include a fastening threaded hole 530 in each of the four corners of the top surface 531 of the first heat sink 202. The top surface 531 of the first heat sink 202, may be the surface located furthest from the power module 112.

The cooling module assembly 200 may further include a fastening rib 532 (e.g., two fastening ribs). The fastening rib 532 may be configured to structurally couple the cooling module assembly 200 to another component (e.g., an inverter, an inverter housing, other inverter components). The fastening rib 532 may be tab shaped and extend outwards from an exterior surface of the cooling module assembly 200. The fastening rib 532 may for example have an opening to facilitate coupling of the cooling module assembly 200. The opening may be circular or any polygon shape. The fastening rib 532 may for example receive a mounting screw. The mounting screw may be any suitable fastener.

FIG. 6 depicts a cooling module assembly 700 with a printed heat sink, according to one or more embodiments. The cooling module assembly 700 may include one or more coupled cooling module assemblies (e.g., six of cooling module assembly 200). The cooling module assemblies may be connected together by a cradle 734 and at a fluid coupling 736 (e.g., one or more of fluid coupling 736, five of fluid coupling 736). The fluid coupling 736 may include an inlet (e.g., inlet 424) and an outlet (e.g., outlet 426) coupled to one another (e.g., by an adhesive).

The cradle 734 may be for example a framework of bars and/or rods. The cradle 734 may for example couple to the fastening threaded hole 530 of the cooling module assemblies.

The cooling module assemblies may further be connected at fluid coupling 736. Within the cooling module assembly 700, there may be one less fluid coupling of fluid coupling 736 then there are cooling module assemblies. For example, a cooling module assembly 700 with six cooling module assemblies may include five couplings of fluid coupling 736. The fluid coupling 736 may be defined by an inlet 424 of a first cooling module assembly (a cooling module assembly 200) and the outlet 426 (depicted in FIG. 4) of a second cooling module assembly (a cooling module assembly 200). The inlet 424 and outlet 426 may be coupled by a coupling component such as a fastener, quick connect fluid connector, brazed tube, and/or a tube equipped with a sealing element such as axial and/or radial seals. The fluid coupling 736 may be configured to allow for a coolant to be transferred from the first cooling module assembly to the second cooling module assembly.

The cooling module assembly 700 may be configured to receive a coolant through an inlet (e.g., inlet 424 or inlet 428) of an outermost cooling module assembly. The coolant may then be configured to travel through an interior of a heat sink (e.g., first heat sink 202, second heat sink 203, or soldered heat sink 318 as depicted in FIG. 2A-3B) of the outermost cooling module assembly and transfer through a fluid coupling 736 to an adjacent cooling module assembly. The coolant may be configured to travel through the respective adjacent heat sinks and couplings of the cooling module assemblies until the coolant reaches an opposite outermost cooling module assembly of the cooling module assembly 700. The coolant may then be expelled through an outlet (e.g., outlet 426). This coolant flow may occur on both sides of the cooling module assembly 700. For example, the coolant may flow in the same direction on both sides of the cooling module assembly 700. In another example, the coolant may flow in opposite directions for respective sides of the cooling module assembly 700.

Figure 7A:
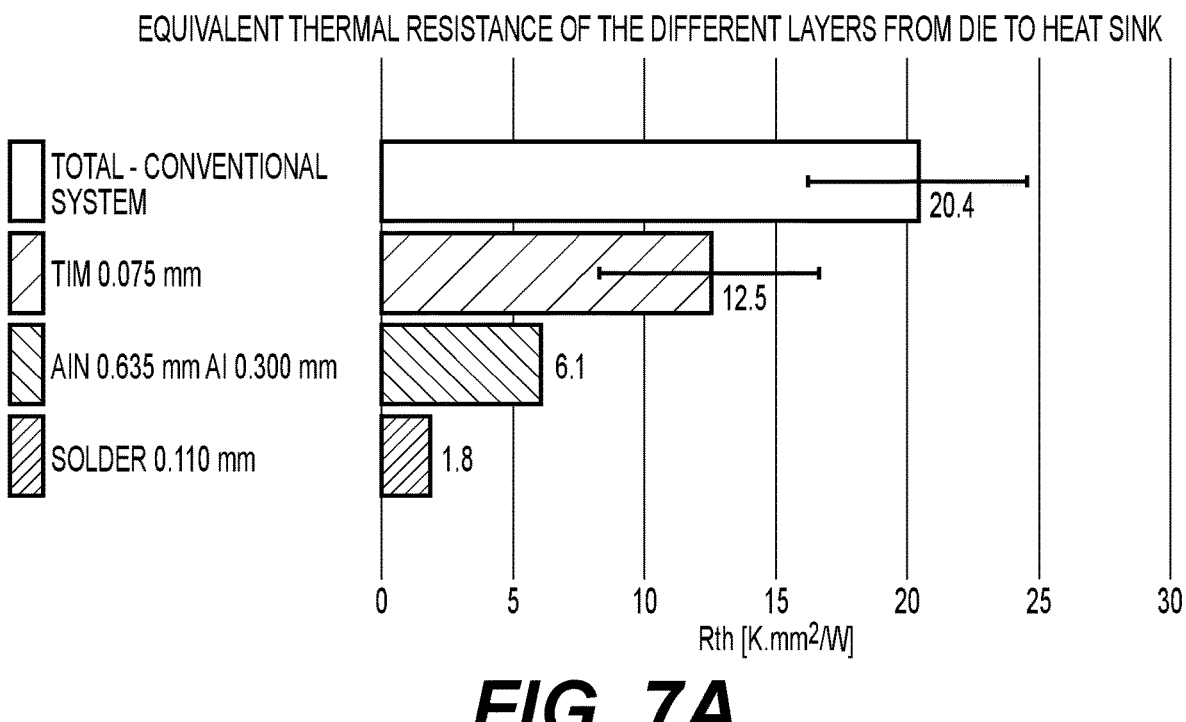
FIG. 7A depicts a thermal resistance chart of a power module, according to one or more embodiments.

FIG. 7A depicts a thermal resistance chart of a power module, according to one or more embodiments. FIG. 7A may depict the thermal resistance from a die to heat sink in a conventional heat sink.

Figure 7B:
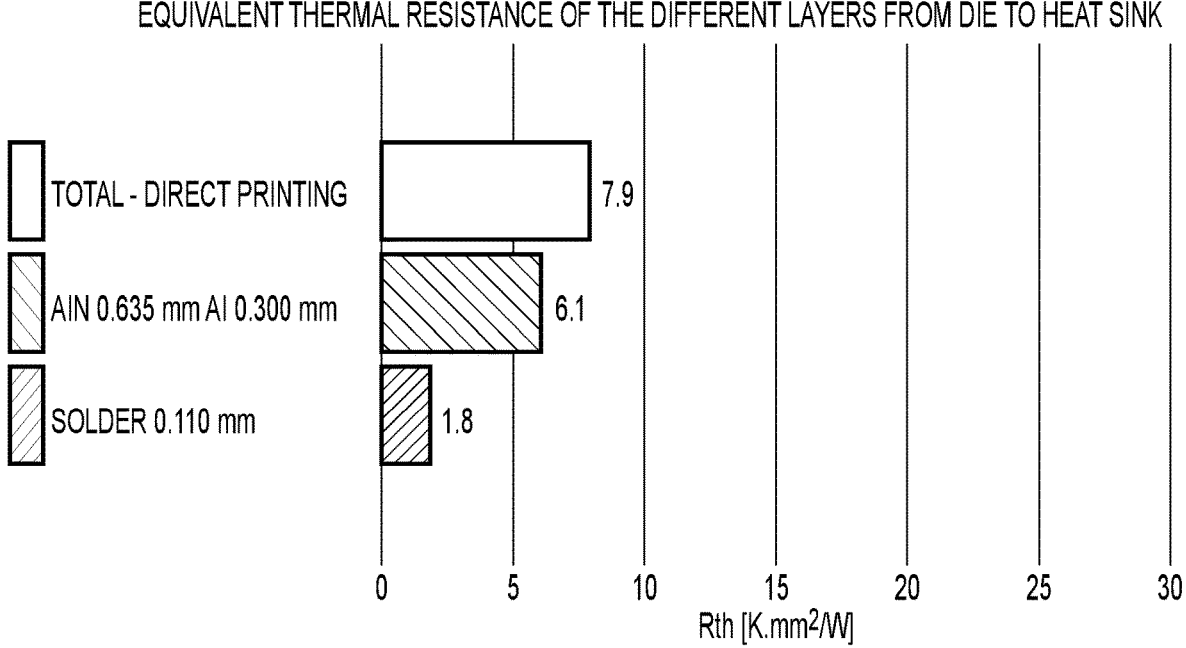
FIG. 7B depicts a thermal resistance chart of a power module, according to one or more embodiments.

FIG. 7B depicts a thermal resistance chart of a power module 112, according to one or more embodiments. The chart may depict how the overall thermal resistance from the die (e.g., power switch 206) to a heat sink (e.g., first heat sink 202) in the disclosed embodiments may have a lower thermal resistance as compared to a conventional system (e.g., as shown in FIG. 7A). For example, by eliminating a TIM layer, the thermal resistance may lower by as much as 12.5 Rth [k.mm^2/W]. As shown, the thermal resistance measured from a die (e.g., power switch 206) to a heat sink (e.g., first heat sink 202) may be 7.9 Rth. The thermal resistance through the solder layer (e.g., solder layer 208) may be 1.8 Rth. The thermal resistance through an exemplary DBM (e.g., DBM layer 210) may be 6.1.

The cooling module assembly 200 may for example be formed by three-dimensionally printing a heat sink (e.g., first heat sink 202) onto a layer (e.g., second copper layer 216 of the power module 112). A method of forming a cooling module assembly 200 may include soldering a power switch 206 to a DBM layer 210, the DBM layer 210 including: a first copper layer 212; an aluminum nitride layer 214; and a second copper layer 216, wherein the aluminum nitride layer 214 is located in between the first copper layer 212 and the second copper layer 216, wherein the second copper layer 216 is located furthest from the power switch 206; and three-dimensionally printing a first heat sink 202 onto the surface of the second copper layer 216, the first heat sink 202 including fins 423, an inlet 424, and an outlet 426. For example, the three-dimensionally printing technique may utilize a metal powder bed fusion process.

One or more embodiments may include a cooling module assembly for a power module that includes a heat sink (e.g., two heat sinks) directly printed to the power module. The heat sink may be directly printed to the DBM of the power module. One or more embodiments may be achieved by a laser metal fusion process (e.g., metal additive manufacturing). For example, metal powder layers may be melted by a laser to form a heat sink.

One or more embodiments may allow for an aluminum heat sink printed on a direct bond aluminum (DBA) layer and a copper heat sink printed on a direct bond copper (DBC) layer of components (e.g., of power modules). Various other heat sinks of different metals may be printed on corresponding types of metals utilizing the systems and methods described herein.

One or more embodiments may exclude TIM layers from a power module and the thermal resistance associated with the TIM layer may be removed. As a result, a higher current density may be achieved for a given power silicon content of a power module. Alternatively, as a result, a reduced price of materials may be achieved at a set current density for a power module.

One or more embodiments may include a heat sink that is printed with the same material as the DBM layer. This may allow for the same conductivity to apply from the DBM to the heat sink, allowing for low thermal resistance from junction to coolant.

One or more embodiments may include a het sink that includes pin fins or other features to optimize the thermal performance of the heat sink. The pin fins may for example be used to disperse heat into a coolant that flows through the heat sink.

What is claimed is:

1. A system for an electric vehicle, the system comprising:
   a power switch configured to convert DC power from a battery to AC power to drive a motor;
   a direct bonding material layer coupled to the power switch by a first solder material; and
   a three-dimensionally printed heat sink (3D heat sink) that is three-dimensionally printed onto the direct bonding material layer,
   wherein the direct bonding material layer includes:
   a first copper layer;
   an aluminum nitride layer; and
   a second copper layer, wherein the aluminum nitride layer is located between the first copper layer and the second copper layer.

2. The system of claim 1, wherein the power switch includes silicon carbide.

3. The system of claim 1, further comprising:
   a second solder material coupled to the power switch;
   a second direct bonding material layer coupled to the second solder material; and
   a second heat sink three-dimensionally printed to the second direct bonding material layer, the second direct bonding material layer being of a material configured to allow for the 3D heat sink to be three-dimensionally printed onto the direct bonding material layer.

4. The system of claim 3, wherein the second direct bonding material layer includes:
   a first copper layer;
   an aluminum nitride layer; and
   a second copper layer.

5. The system of claim 1, further comprising:
   a second solder material coupled to the power switch;
   a second direct bonding material layer coupled to the second solder material;
   a thermal interface material coupled to the second direct bonding material layer; and
   a second heat sink coupled to the thermal interface material.

6. The system of claim 1, wherein the direct bonding material layer and the 3D heat sink are a same material.

7. An inverter comprising the system of claim 1.

8. An inverter comprising:
   a power module including:
   a first power switch;
   a three-dimensionally printed first heat sink (first 3D heat sink) coupled to the first power switch, the first 3D heat sink including a first inlet and a first outlet;
   a second power switch;
   a three-dimensionally printed second heat sink (second 3D heat sink) coupled to the second power switch, the second 3D heat sink including a second inlet and a second outlet; wherein the first outlet of the first 3D heat sink is fluidly coupled to the second inlet of the second 3D heat sink;
   a first direct bonding material layer coupled to the first power switch by a first solder material, wherein the first 3D heat sink is three-dimensionally printed onto the first direct bonding material layer;
   a second direct bonding material layer coupled to the second power switch by a second solder material, wherein the second 3D heat sink is three-dimensionally printed onto the second direct bonding material layer;
   a third direct bonding material layer coupled to the first power switch by a third solder material;

a three-dimensionally printed third heat sink (third 3D heat sink) three-dimensionally printed to the third direct bonding material layer, the third 3D heat sink including a third inlet and a third outlet;

a fourth direct bonding material layer coupled to the second power switch by a fourth solder material; and a three-dimensionally printed fourth heat sink (fourth 3D heat sink) three-dimensionally printed to the fourth direct bonding material layer, the fourth 3D heat sink including a fourth inlet and a fourth outlet; wherein the third outlet of the third 3D heat sink is fluidly coupled to the fourth inlet of the fourth 3D heat sink.

9. The inverter of claim 8, wherein the first direct bonding material layer includes:

a first copper layer;

an aluminum nitride layer; and a second copper layer, wherein the aluminum nitride layer is located between the first copper layer and the second copper layer.

10. The inverter of claim 8, wherein the second direct bonding material layer includes:

a third copper layer;

a second aluminum nitride layer; and a fourth copper layer, wherein the second aluminum nitride layer is located between the third copper layer and the fourth copper layer.

11. The inverter of claim 8, wherein the first 3D heat sink is a same material as a layer of the first direct bonding material layer.

12. The inverter of claim 8, wherein the second 3D heat sink is a same material as a layer of the second direct bonding material layer.

13. A vehicle comprising the inverter of claim 8.

14. A method of forming a cooling module assembly, the method comprising:

three-dimensionally printing a heat sink onto a direct bonding material layer coupled by a solder material to a power switch configured to convert DC power from a battery to AC power to drive a motor, wherein the direct bonding material layer includes:

a first copper layer;

a second copper layer; and an aluminum nitride layer located between the first copper layer and the second copper layer.

\* \* \* \* \*